(12) United States Patent
Takano et al.

(10) Patent No.: US 11,137,437 B2
(45) Date of Patent: Oct. 5, 2021

(54) PROBE DEVICE, ELECTRICAL INSPECTION APPARATUS, AND ELECTRICAL INSPECTION METHOD

(71) Applicant: NIPPON MEKTRON, LTD., Tokyo (JP)

(72) Inventors: Shoji Takano, Tokyo (JP); Fumihiko Matsuda, Tokyo (JP); Yoshihiko Narisawa, Tokyo (JP)

(73) Assignee: NIPPON MEKTRON, LTD., Tokyo (JP)

(*) Notice: Subject to any disclaimer, the term of this patent is extended or adjusted under 35 U.S.C. 154(b) by 117 days.

(21) Appl. No.: 16/668,093

(22) Filed: Oct. 30, 2019

(65) Prior Publication Data
US 2020/0166564 A1 May 28, 2020

(30) Foreign Application Priority Data

Nov. 27, 2018 (JP) .............................. JP2018-221620

(51) Int. Cl.
*G01R 31/28* (2006.01)
*G01R 1/073* (2006.01)
*H01R 12/71* (2011.01)

(52) U.S. Cl.
CPC ..... *G01R 31/2808* (2013.01); *G01R 1/07364* (2013.01); *H01R 12/714* (2013.01); *H01R 2201/20* (2013.01)

(58) Field of Classification Search
CPC ............ G01R 1/06772; G01R 1/07328; G01R 1/07364; G01R 31/2808; G01R 31/2812; G01R 31/2805; G01R 31/52; G01R 31/2887; G01R 31/70; G01R 1/06794; G01R 31/2813; G01R 1/073; H01R 12/714; H01R 2201/20; H01R 12/61; H01R 13/7031; H01R 24/58; H01R 12/523; H01R 12/716; H01R 13/2414; H01R 43/205; H01R 31/08; H01R 43/007; H05K 1/142

See application file for complete search history.

(56) References Cited

U.S. PATENT DOCUMENTS

| | | | | |
|---|---|---|---|---|
| 4,056,773 A | * | 11/1977 | Sullivan ............. | G01R 31/2812 324/500 |
| 4,897,598 A | * | 1/1990 | Doemens ............ | G01R 1/07371 324/500 |
| 5,744,964 A | * | 4/1998 | Sudo ................... | G01R 31/2805 324/519 |
| 2005/0038613 A1 | * | 2/2005 | Yamaoka ............ | G01R 31/2812 702/58 |

FOREIGN PATENT DOCUMENTS

| | | | |
|---|---|---|---|
| JP | H02275364 | * | 11/1990 |
| JP | 2001-343406 | | 12/2001 |
| JP | 2019-106508 | | 6/2019 |

* cited by examiner

*Primary Examiner* — Vinh P Nguyen
(74) *Attorney, Agent, or Firm* — Lex IP Meister, PLLC

(57) ABSTRACT

Provided is a probe device used for electrical inspection of a printed wiring board, the probe device including at least one probe group including a plurality of wire probes configured to be able to simultaneously abut against a wire provided on the printed wiring board and extending in a specified direction, the plurality of wire probes abutting against the wire along the direction and being electrically connected to each other.

14 Claims, 17 Drawing Sheets

US 11,137,437 B2

PROBE DEVICE, ELECTRICAL INSPECTION APPARATUS, AND ELECTRICAL INSPECTION METHOD

CROSS-REFERENCE TO RELATED APPLICATIONS

This patent application is based on and claims priority pursuant to 35 U.S.C. § 119(a) to Japanese Patent Application No. 2018-221620, filed on Nov. 27, 2018, in the Japan Patent Office, the entire disclosure of which is hereby incorporated by reference herein.

BACKGROUND

Field of the Invention

The present invention relates to a probe device, an electrical inspection apparatus, and an electrical inspection method and, in particular, to a probe device used for electrical inspection of a printed wiring board, an electrical inspection apparatus including the probe device, and an electrical inspection method using the electrical inspection apparatus.

Description of the Related Documents

With an increase in a signal transmission speed in electronic equipment, thin-wire coaxial cables are frequently used as wires for high-speed signal transmission. In recent years, parallel transmission of a plurality of high-speed signals and space saving are further requested. To fulfill such requests, application of a printed wiring board that is more space-saving than the thin-wire coaxial cable and allows in-apparatus wiring is in progress. For example, Japanese Patent Application No. 2017-239767 discloses a printed wiring board provided with a plurality of high-speed signal transmission wires (hereinafter, also simply referred to as "signal wires") for transmitting the high-speed signal.

It is necessary to measure an electrical characteristic of a printed wiring board provided with a high-speed signal transmission wire. Japanese Unexamined Patent Application Publication No. 2001-343406 discloses a coaxial probe having a signal pin and a ground pin. In addition, a probe card, in which a plurality of probes are arranged at a narrow pitch according to terminals of the printed wiring board targeted for inspection, is known.

Conventionally, it is known to use an inspection jig having the probe pin such as a wire probe for inspection of the basic electrical characteristics such as direct-current (DC) resistance and insulation resistance of the wire of the printed wiring board. In this inspection jig, the probe pin is disposed at a position corresponding to the terminal of the printed wiring board targeted for the inspection. A switcher for switching an output destination of a measurement signal is provided between the inspection jig and a measuring instrument. When electrical inspection is conducted, the probe pins are brought into contact one-by-one with the plurality of terminals (a signal terminal, a ground terminal, and the like) of the printed wiring board. Thereafter, the output destination of the measurement signal is switched using the switcher to conduct the electrical inspection of the plurality of wires of the printed wiring board.

It is desired to inexpensively inspect the electrical characteristics of the printed wiring board provided with the plurality of signal wires, specifically, a characteristic impedance of the signal wire, a frequency characteristic in transmission loss of an alternating-current (AC) signal, crosstalk between the adjacent signal wires, and the like. In addition, needless to say, the accurate electrical inspection is requested.

In addition, it is also desired to efficiently conduct the electrical inspection of the printed wiring board. For example, in order to measure the crosstalk efficiently, the probes have to be simultaneously and collectively brought into contact with the terminals of the plurality of signal wires, which are arranged at the narrow pitch. However, when it is attempted to use the coaxial probe as disclosed in Japanese Unexamined Patent Application Publication No. 2001-343406, the coaxial probe has to be moved for each of the signal wires targeted for the inspection, and it is thus difficult to conduct the electrical inspection efficiently. Furthermore, a clearance between the signal pin and the ground pin of the coaxial probe is relatively large. Thus, in the case where a wiring pitch of the printed wiring board is narrow, there is a possibility that the coaxial probe cannot be used.

Meanwhile, in the case of the inspection jig using the probe pin such as the wire probe, the output destination of the measurement signal is switched using the switcher, and it is thus possible to efficiently conduct the electrical inspection of the plurality of wires of the printed wiring board. However, especially in the case of a high-frequency signal, it is difficult to match the impedance between the probe pin and the wire of the printed wiring board. In the case where the characteristic impedances are mismatched, reflection of the measurement signal in a contact portion between the probe pin and the wire becomes significant. As a result, the accurate electrical inspection cannot be conducted.

In the case where the electrical inspection is conducted using the probe card, the plurality of probes of the probe card are collectively brought into contact with the plurality of signal wires of the printed wiring board. Thus, the electrical inspection can be conducted efficiently. Furthermore, a distance between the probe card and the printed wiring board is sufficiently shorter than a wavelength of the measurement signal. Thus, the reflection of the measurement signal in the contact portion is suppressed without impedance matching.

The probe card is a dedicated article that is produced according to arrangement of the terminals of the printed wiring board targeted for the inspection. Thus, in the case where the arrangement of the terminals of the printed wiring board is changed, a new probe card has to be produced. However, since the probe card is very expensive, and a production period of the probe card is long, the probe card is not suited for the inexpensive inspection of the electrical characteristics of the printed wiring board.

SUMMARY

The present invention has been made on the basis of the above-described technical recognition, and therefore provides a probe device, an electrical inspection apparatus, and an electrical inspection method capable of inexpensively and accurately conducting electrical inspection of a printed wiring board.

A probe device according to the present invention is a probe device used for electrical inspection of a printed wiring board and includes: at least one probe group including a plurality of probe pins configured to be able to simultaneously abut against a wire provided on the printed wiring board and extending in a specified direction, the plurality of probe pins abutting against the wire along the specified direction and being electrically connected to each other.

In the probe device, a characteristic impedance of the at least one probe group may substantially matches a characteristic impedance of the wire of the printed wiring board.

In the probe device, a probe pitch of the at least one probe group may be shorter than four times a diameter of each of the probe pins.

The probe device may include, as the at least one probe group, a first probe group and a second probe group arranged in parallel with each other, and a length of the first probe group may be longer than a clearance between the first probe group and the second probe group, and a length of the second probe group may be longer than the clearance.

In the probe device, the plurality of probe pins may be arranged on a straight line.

In the probe device, the plurality of probe pins may be arranged in a staggered manner when viewed in the specified direction.

The probe device may include, as the at least one probe group, a first probe group configured to be able to abut against one end of the wire, and a second probe group configured to be able to abut against the other end of the wire.

The probe device may include, as the at least one probe group, a first probe group and a second probe group arranged in parallel with each other, the printed wiring board may be provided with, as the wire, a ground wire and a signal wire that is adjacent to the ground wire, and the first probe group may be configured to be able to abut against the ground wire, and the second probe group may be configured to be able to abut against the signal wire.

The probe device may include, as the at least one probe group, a first probe group, a second probe group, and a third group arranged in parallel with each other, the printed wiring board may be provided with, as the wire, a signal wire, and a first ground wire and a second ground wire holding the signal wire therebetween, and the first probe group may be configured to be able to abut against the first ground wire, the second probe group may be configured to be able to abut against the signal wire, and the third probe group may be configured to be able to abut against the second ground wire.

In the probe device, a length of the second probe group may be shorter than a length of the first probe group and may be shorter than a length of the third probe group.

In the probe device, a probe pitch of each of the first and third probe groups may be shorter than a probe pitch of the second probe group.

In the probe device, the probe pins provided in the first probe group to the third probe group may be arranged on a straight line when viewed in a direction orthogonal to the specified direction.

The probe device may further include: a first fixing member that fixes a base end side of the probe pin provided in the at least one probe group; a second fixing member that fixes a tip end side of the probe pin provided in the at least one probe group; and a spacer member that connects the first fixing member and the second fixing member.

An electrical inspection apparatus according to the present invention is an apparatus for inspecting an electrical characteristic of a printed wiring board and includes: the probe device; and a measuring instrument that outputs a measurement signal to the probe device and receives a signal detected by the probe device.

An electrical inspection method according to the present invention is a method for inspecting an electrical characteristic of a printed wiring board by using the electrical inspection apparatus and includes: making the at least one probe group abut against the wire; applying a measurement signal to the signal wire via the probe group that abuts against the signal wire of the printed wiring board; and receiving a signal detected by the probe device.

According to the present invention, the electrical inspection of the printed wiring board can be conducted inexpensively and accurately.

DETAILED DESCRIPTION

Figure 1A:
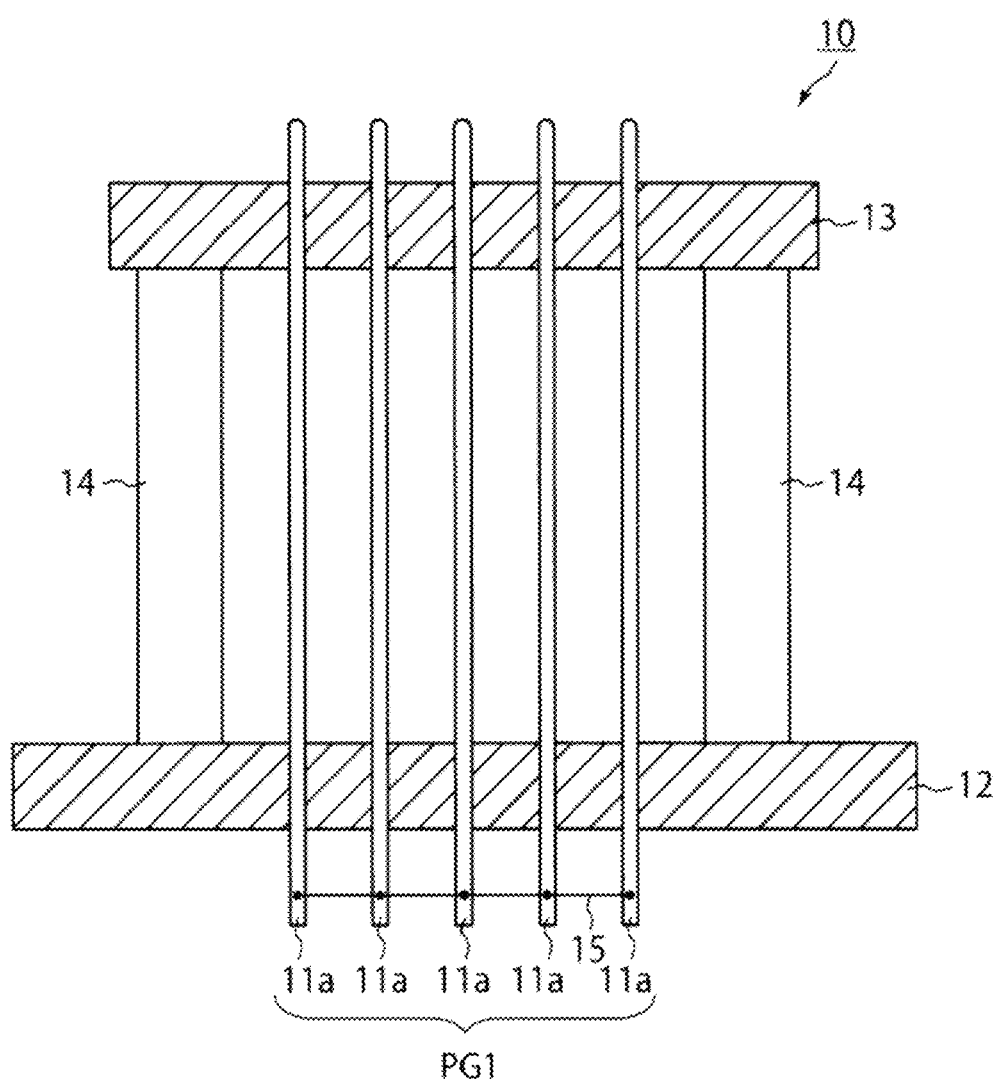
FIG. 1A is a cross-sectional view of a probe device according to an embodiment.

A description will hereinafter be made on an embodiment according to the present invention with reference to the drawings. In the drawings, components that have equivalent functions will be denoted by the same reference numerals. In addition, the drawings are schematically illustrated, and dimensions, a ratio between the components, and the like may not match actual ones.

<Printed Wiring Board>

Before a detailed description on a probe device 10 according to the embodiment is made, a description will be made on an example of a printed wiring board 100 targeted for inspection with reference to FIG. 2 and FIG. 3.

Figure 2:
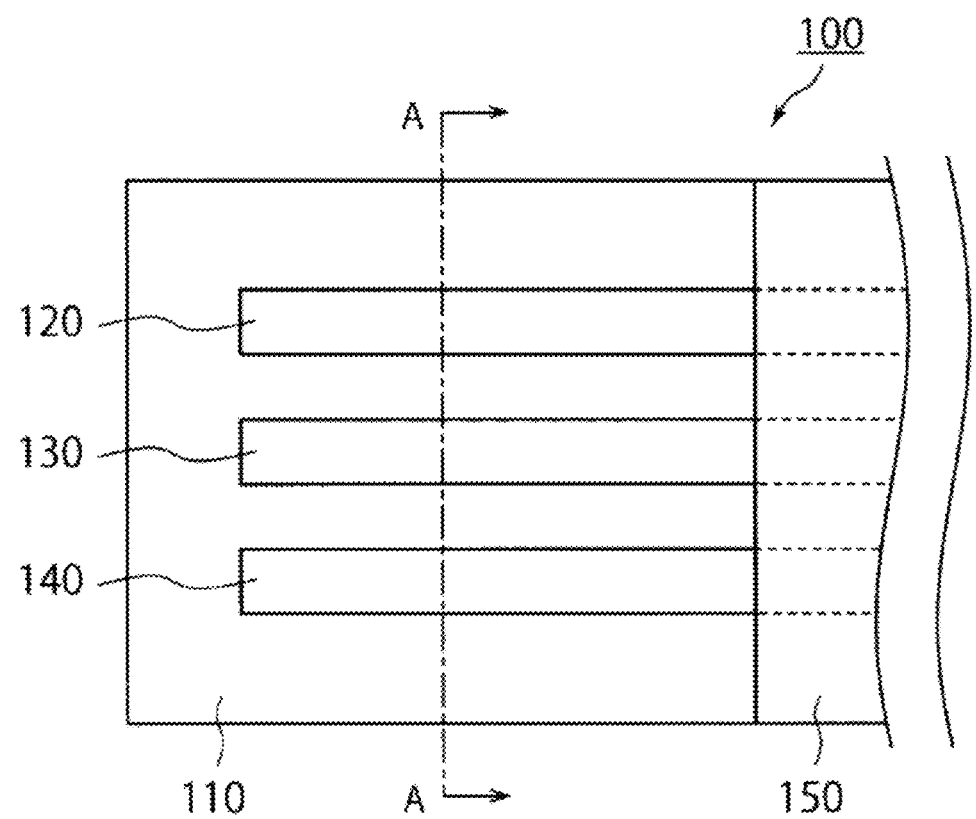
FIG. 2 is a plan view of a printed wiring board targeted for electrical inspection.
Figure 3:
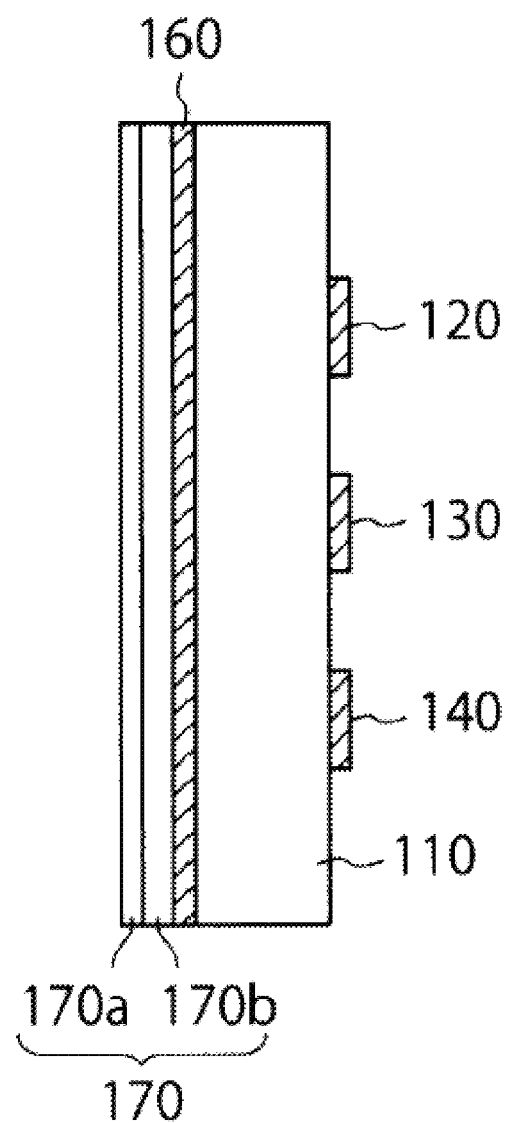
FIG. 3 is a cross-sectional view taken along line AA in FIG. 2.

As illustrated in FIG. 2 and FIG. 3, the printed wiring board 100 includes an insulating base 110, a signal wire 130 and ground wires 120, 140 provided on a main surface of the insulating base 110, a cover lay 150, a ground layer 160, and a cover lay 170. Although not illustrated, the printed wiring board 100 is provided with an interlayer conductive path (a filled via hole, a through hole, and the like) that electrically connects the ground wires 120, 140 and the ground layer 160.

The insulating base 110 may be constructed of a flexible material such as polyimide, polyethylene terephthalate (PET), or a liquid crystal polymer (LCP), or may be constructed of an inflexible material such as glass epoxy.

As illustrated in FIG. 2, the signal wire 130 and the ground wires 120, 140 extend parallel to each other in a specified direction (for example, a longitudinal direction of the printed wiring board 100). The signal wire 130 is adjacent to the ground wire 120, and the ground wire 140 is adjacent to the signal wire 130. That is, the signal wire 130 is held between the two ground wires 120, 140.

In the following description, the signal wire 130 and the ground wires 120, 140 will also collectively and simply be referred to as "wires".

A characteristic impedance of each of the wires of the printed wiring board 100 is set to have a specified value (for example, 50Ω).

The cover lay 150 is provided to insulate and protect the wires of the printed wiring board 100. As illustrated in FIG. 2, the cover lay 150 is formed such that a terminal portion provided at an end of each of the wires is exposed. Here, the cover lay 150 may be formed up to an end (a left end in FIG. 2) of the printed wiring board 100, and an opening may be provided in a portion corresponding to the terminal.

A description will be made on a structure of the printed wiring board 100 in a thickness direction with reference to FIG. 3. The ground layer 160 is formed on a back surface of the insulating base 110. This ground layer 160 covers the entire back surface. Note that the ground layer 160 may only be provided in a specified region (for example, a region corresponding to a region where the wires are formed). In addition, the ground layer 160 is not limited to have a layer shape, but may be formed to have a specified shape such as a mesh shape.

The cover lay 170 is provided to insulate and protect the ground layer 160. The cover lay 170 has: a film layer 170a; and an adhesive layer 170b used to make the film layer 170a adhere to the insulating base 110.

Needless to say, a configuration of the printed wiring board targeted for the inspection is not limited to the above example. For example, the number of the signal wire and the number of the ground wires may differ from those in the above example. The single ground wire may be provided. In addition, a shape of each of the wires is not limited to a linear shape, and any shape may be adopted as long as each of the wires serves as a signal transmission path. Furthermore, the multi-layered printed wiring board provided with a plurality of layers of the wires may be adopted.

<Probe Device>

A description will be made on the probe device 10 according to the embodiment of the present invention with reference to FIG. 1A and FIG. 1B. The probe device 10 is used to inspect electrical characteristics (the characteristic impedance, transmission loss, crosstalk, and the like) of the printed wiring board. The probe device will also be referred to as a probe jig.

Figure 1B:
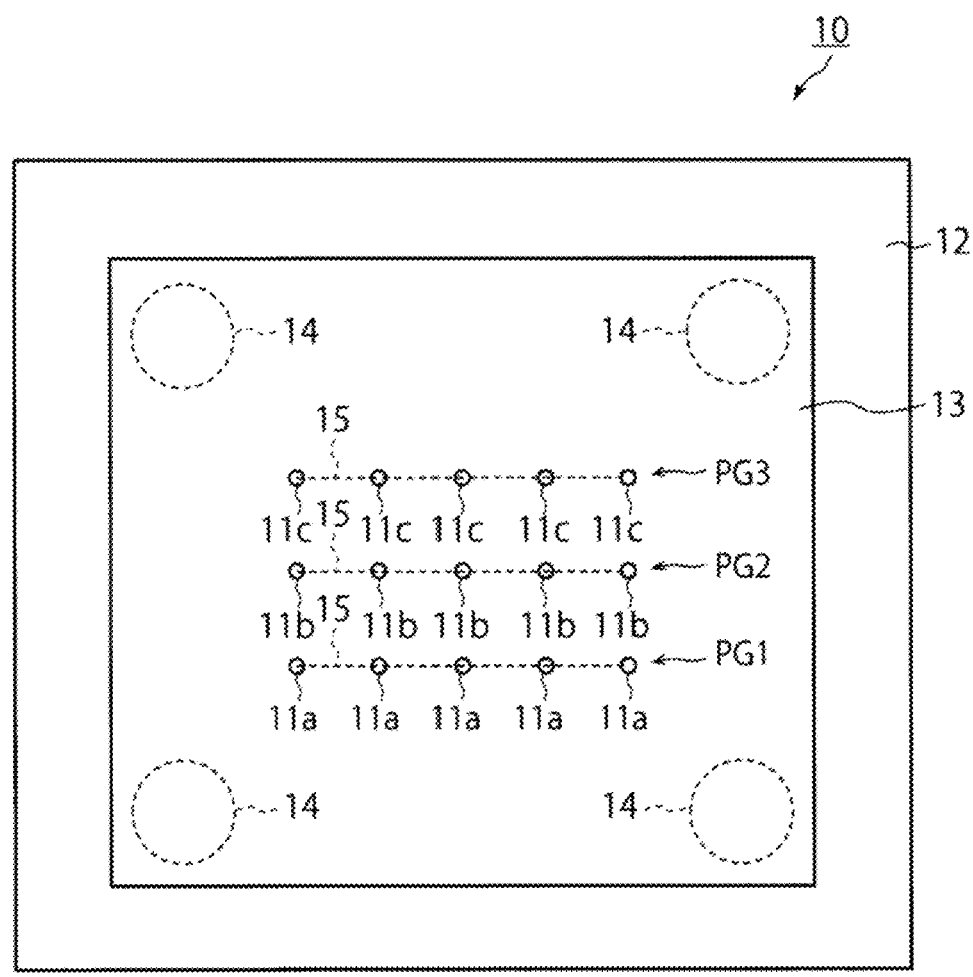
FIG. 1B is a plan view of the probe device according to the embodiment.

As illustrated in FIG. 1A and FIG. 1B, the probe device 10 includes a plurality of probe groups PG1 to PG3, a fixing member 12 (a first fixing member), a fixing member 13 (a second fixing member), a spacer member 14, and conductive connection members 15.

In the present embodiment, the probe device 10 has three of the probe group PG1, the probe group PG2, and the probe group PG3 that are arranged in parallel with each another. The probe groups PG1, PG2, PG3 are configured to be able to abut against the ground wire 120, the signal wire 130, and the ground wire 140 of the printed wiring board 100, respectively. The probe group PG1, the probe group PG2, and the probe group PG3 are disposed according to a pitch between two each of the ground wire 120, the signal wire 130, and the ground wire 140 of the printed wiring board 100.

The number of the probe groups is not limited to three and can take an arbitrary value of one or more according to the number of the wires of the printed wiring board targeted for the inspection, or the like.

Each of the probe groups PG1 to PG3 includes a plurality of probe pins. In the present embodiment, a wire probe is used as each of the probe pins. That is, the probe group PG1 includes a plurality of wire probes 11a, the probe group PG2 includes a plurality of wire probes 11b, and the probe group PG3 includes a plurality of wire probes 11c.

Instead of the wire probe, another type of the probe (a spring-type probe or the like) may be used as the probe pin. In any case, an inexpensive probe used for DC resistance inspection can be adopted as the probe pin.

In addition, in the present embodiment, the five wire probes are provided in each of the probe groups. However, the number of the wire probes is not limited thereto.

As illustrated in FIG. 1B, in the present embodiment, the plurality of wire probes 11a to 11c respectively provided in the probe groups PG1 to PG3 are each arranged on a straight line. In addition, the wire probes 11a to 11c respectively provided in the probe groups PG1 to PG3 are each arranged on the straight line when viewed in a direction (a vertical direction in FIG. 1B) orthogonal to an extending direction of the wires of the printed wiring board 100. That is, the wire probes 11a to 11c are arranged in a grid shape in a plan view.

Each of the wire probes 11a to 11c is a thin metal wire that is made of tungsten or the like. When abutting against the printed wiring board 100, each of the wire probes 11a to 11c receives a force in the longitudinal direction and is bent, and thereby the contact thereof with the printed wiring board 100 is secured. A base end side of each of the wire probes 11a to 11c is fixed by the fixing member 12, and a tip side thereof is fixed by the fixing member 13. In the present embodiment, the wire probes 11a to 11c are inserted through a plurality of through holes, which are provided in a grid shape in the plate-shaped fixing members 12, 13, and are fixed by an adhesive or the like.

A shape of the tip (an upper end in FIG. 1A) of each of the wire probes 11a to 11c is not particularly limited, and may be a semicircular shape, a needle shape, a flat shape, or the like. In addition, a cross-sectional shape of each of the wire probes 11a to 11c is not particularly limited, either, and may be an oval shape, a rectangular shape, or the like in addition to a circular shape. A diameter of each of the wire probes 11a to 11c is 10 μm to 150 μm, for example. A length of each of the wire probes 11a to 11c is 20 mm to 120 mm, for example.

As will be described later by using a result of an electromagnetic field analysis simulation, a characteristic impedance of each of the probe groups PG1 to PG3 substantially matches the characteristic impedance of each of the wire of the printed wiring board 100.

As illustrated in FIG. 1B, the wire probes that belong to the same probe group are electrically connected to each other by the conductive connection member 15. The form of the electrical connection is not limited thereto, and, for example, the wire probes that belong to the same probe group may be bundled into one and be thereby electrically connected.

Each of the fixing members 12 and 13 is made of an insulating material such as glass epoxy or Bakelite, and fixes the wire probes 11a to 11c provided in the probe groups PG1 to PG 3. That is, the fixing member 12 fixes the base end side of each of the wire probes 11a to 11c, and the fixing member 13 fixes the tip side of each of the wire probes 11a to 11c. As illustrated in FIG. 1A and FIG. 1B, in the present embodiment, each of the fixing members 12, 13 is a plate member.

The spacer member 14 is a member that connects the fixing member 12 and the fixing member 13. In this way, the fixing member 12 and the fixing member 13 are held in parallel with each other with a specified clearance being interposed therebetween. In the present embodiment, as illustrated in FIG. 1A and FIG. 1B, the four spacer members 14 are provided at corners of each of the square fixing members 12, 13.

Figure 4:
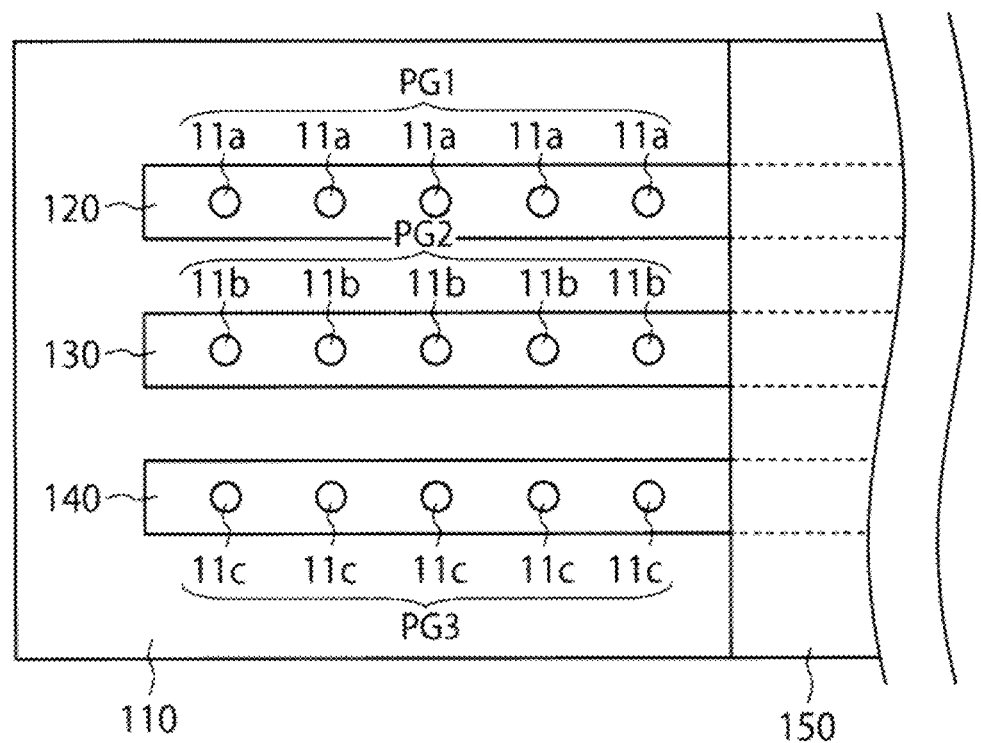
FIG. 4 is a plan view of an example of an aspect in which the wire probe of the probe device according to the embodiment abuts against the printed wiring board.
Figure 5:
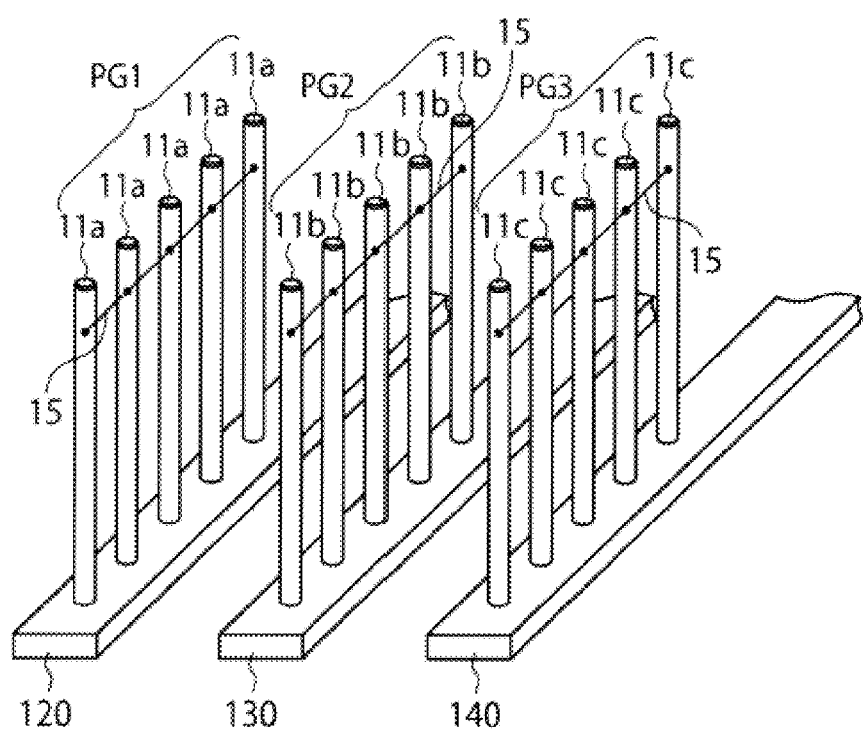
FIG. 5 is a perspective view of the example of the aspect in which the wire probe of the probe device according to the embodiment abuts against the printed wiring board.

Next, a description will be made on an abutment mode between the probe groups PG1 to PG3 and the printed wiring board 100 with reference to FIG. 4 and FIG. 5. FIG. 4 illustrates a state where the wire probes 11a to 11c in the probe device 10 abut against the wires of the printed wiring board 100. FIG. 5 is a perspective view of such states. The fixing members 12, 13 and the spacer members 14 are not illustrated in FIG. 5.

As illustrated in FIG. 4 and FIG. 5, the plurality of wire probes 11a provided in the probe group PG1 are configured to be able to simultaneously abut against the ground wire 120 along the extending direction of the ground wire 120. Similarly, the plurality of wire probes 11b provided in the probe group PG2 are configured to be able to simultaneously abut against the signal wire 130 along the extending direction of the signal wire 130, and the plurality of wire probes 11c provided in the probe group PG3 are configured to be able to simultaneously abut against the ground wire 140 along the extending direction of the ground wire 140.

In addition, among the wire probes 11a to 11c provided in the plurality of probe groups PG1 to PG3, the wire probes provided in the same probe group are electrically connected to each other. Thus, each of the probe groups having the plurality of wire probes functions as one pseudo probe. The same electrical signal (measurement signal) is output from the wire probes, which belong to the same probe group, to the signal wire 130 of the printed wiring board 100.

According to the above probe device 10, as will be described later in detail with reference to the result of the electromagnetic field analysis simulation, the characteristic impedance of each of the probe groups can be lowered and can substantially match the characteristic impedance of each of the wires.

Although the plurality of probe groups are provided in the probe device 10, the present invention is not limited thereto. More specifically, the probe group may contact the particular wire of the printed wiring board, and the only one wire probe may contact the other wires as in the background art. For example, while the plurality of wire probes may contact the signal wire 130, the one wire probe may contact the ground wires 120, 140.

<Arrangement Dimension relationship of Wire Probes>

A description will herein be made on an arrangement dimension relationship among the plurality of wire probes provided in each of the probe groups and an arrangement dimension relationship among the plurality of probe groups.

Figure 1C:
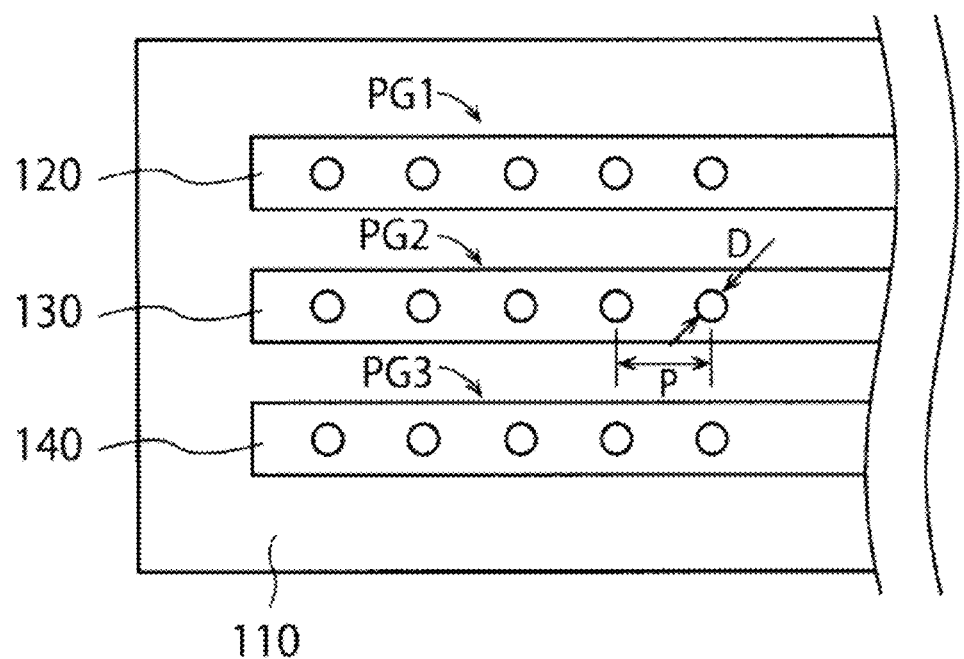
FIG. 1C is a view for illustrating a relationship between a probe pitch (P) and a diameter (D) of a wire probe.

First, a description will be made on a relationship between the diameter of each of the wire probes and a probe pitch with reference to FIG. 1C. Here, the probe pitch is a distance between centers of the adjacent wire probes among the plurality of wire probes provided in the probe group. In FIG. 1C, the probe pitch is denoted by a reference symbol P, and the diameter of the wire probe is denoted by a reference symbol D.

The probe pitch P is preferably shorter than a length based on the diameter D of the wire probe. More specifically, the probe pitch P is preferably shorter than four times the diameter D of the wire probe (that is, P<4D). In this way, when the measurement signal is applied from the probe group to the corresponding wire of the printed wiring board, electric fields around the wire probes are closely synthesized, and the probe group functions as a pseudo oval probe. As a result, the characteristic impedance of the probe group can efficiently be lowered.

Figure 1D:
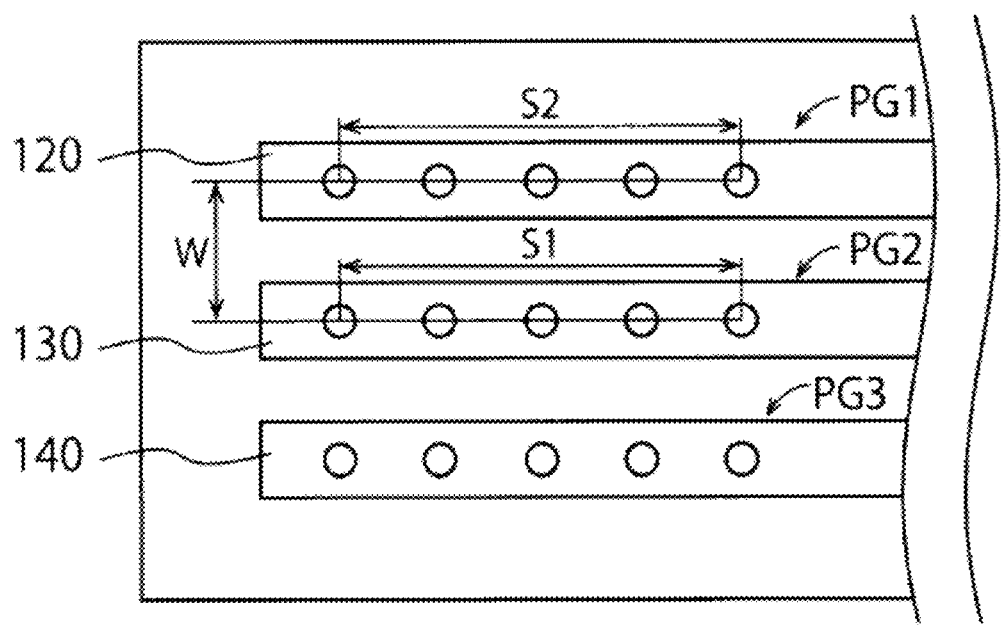
FIG. 1D is a view for illustrating a relationship between lengths (S1, S2) of probe groups and a clearance (W) between the probe groups.

Next, a description will be made on a relationship between a length of each of the probe groups and a clearance between the probe groups with reference to FIG. 1D. Here, the length of each of the probe groups is a distance between the centers of the wire probes located on both ends (a left end and a right end in FIG. 1D) among the plurality of wire probes provided in each of the probe groups. The clearance between the probe groups is a distance between the adjacent probe groups. Further in detail, a clearance between a first probe group and a second probe group is the shortest distance between the wire probes provided in the first probe group and the wire probes provided in the second probe group. In FIG. 1D, the lengths of the probe groups are denoted by reference signs and symbols S1, S2, and the clearance between the probe groups is denoted by a reference symbol W.

As illustrated in FIG. 1D, the length S1 of the probe group PG1 is longer than the clearance W between the probe group PG1 and the probe group PG2, and the length S2 of the probe group PG2 is longer than the clearance W. That is, the lengths S1, S2 of the adjacent probe groups are each longer than the clearance W between the probe groups. Thus, when the measurement signal is applied to the wires of the printed wiring board via the probe group, the electric fields around the wire probes are closely synthesized, and the probe group functions as the pseudo oval probe. As a result, the characteristic impedances of the probe group can efficiently be lowered.

<Electrical Inspection Apparatus>

Next, a description will be made on the electrical inspection apparatus using the probe device 10.

The electrical inspection apparatus according to the present embodiment includes: the probe device 10; and a measuring instrument that outputs the measurement signal to the probe device 10 and receives a signal detected by the probe device 10.

In the case where the plurality of signal wires are provided as in a printed wiring board 100A, which will be described later, a switcher (not illustrated) as a signal output destination switch may be provided between the measuring instrument and the probe device.

As the measuring instrument, time-domain reflectometry (TDR) is used when the characteristic impedance is measured, for example, and a digital oscilloscope is used when the transmission loss or the crosstalk is measured, for example.

As described with reference to FIG. 4 and FIG. 5, the tips of the wire probes 11a to 11c contact the wires of the printed wiring board 100. Meanwhile, the base ends of the wire probes 11a to 11c are electrically connected to the measuring instrument. Further in detail, the base end of the probe group PG2 is electrically connected to a signal output terminal of the measuring instrument, and the base ends of the probe groups PG1, PG3 are electrically connected to a ground terminal of the measuring instrument.

<Electrical Inspection Method>

A description will be made on an electrical inspection method according to the embodiment.

First, at least one of the probe groups is made to abut against the corresponding wire of the printed wiring board (step S1). Thereafter, the measuring signal is applied from the measuring instrument to the signal wire of the printed wiring board via the probe group that abuts against this signal wire (step S2). More specifically, the measurement signal is applied to the signal wire 130 of the printed wiring board 100 via the probe group PG2. As described above, since the plurality of wire probes 11b are electrically connected to each other, the same measurement signal (in the case of the AC signal, a signal of the same phase) is applied to the signal wire 130 from each of the plurality of wire probes 11b. Then, the measuring instrument receives the signal detected by the probe device 10 (step S3).

A further detailed description will be made on the electrical inspection method for each inspection item.

In the case of measuring the characteristic impedance of the signal wire, in step S1, as illustrated in FIG. 4 and FIG. 5, the plurality of wire probes 11b of the probe group PG2 is made to abut against one end (for example, an input end) of the signal wire 130, and the wire probes 11a, 11c of the probe groups PG1, PG3 are respectively made to abut against one ends (for example, input ends) of the ground wires 120 and 140.

In step S2, a high-speed pulse signal or a step signal that is output from a TDR impedance measuring instrument is applied to the signal wire 130 via the probe group PG2. Then, in step S3, a reflection waveform that is detected via the probe group PG2 is measured.

Figure 6:
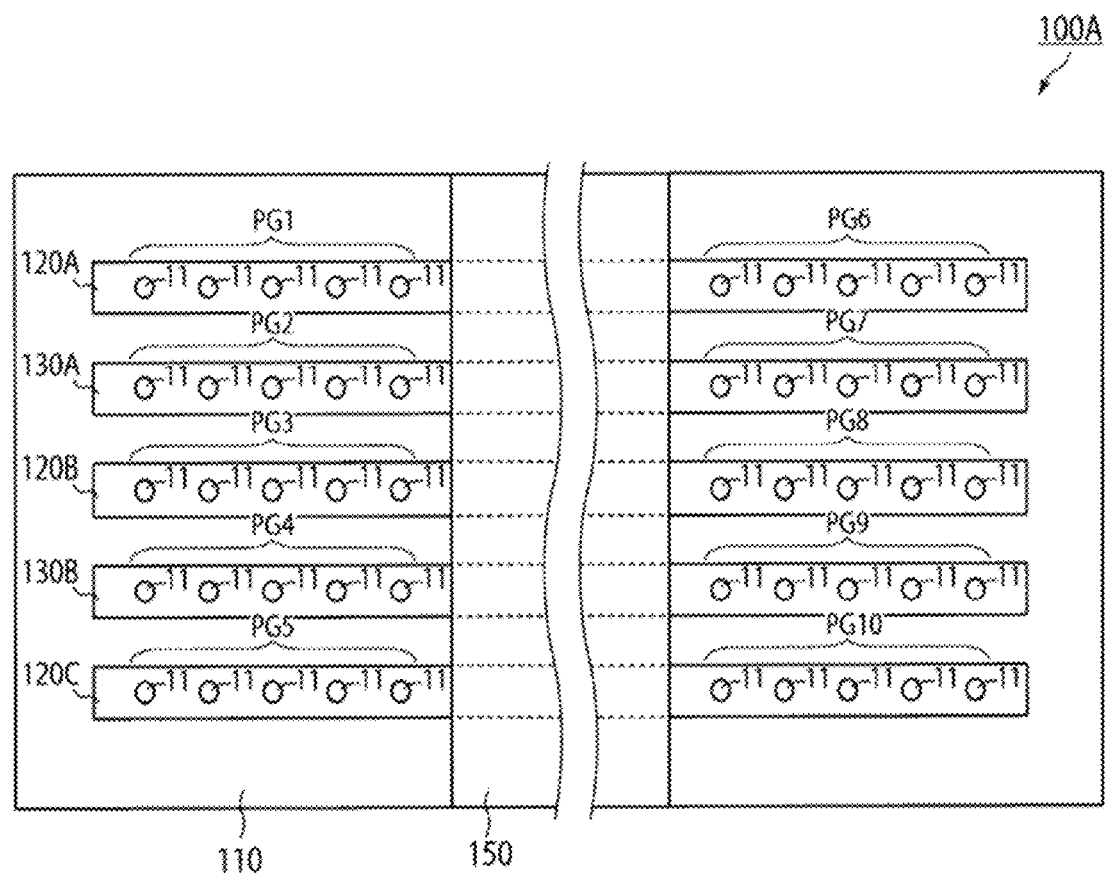
FIG. 6 is a plan view for illustrating an aspect in which the probe group abuts against both ends of a wire of the printed wiring board.

In the case of measuring the transmission loss or the crosstalk, in step S1, the two probe devices (a first probe device and a second probe device) are prepared, and the wire probes of each of the probe devices are brought into contact with both of the ends (the input end and the output end) of the wire of the printed wiring board. A detailed description will be made thereon with reference to FIG. 6. FIG. 6 illustrates the printed wiring board 100A in which two signal wires 130A, 130B and three ground wires 120A, 120B, 120C are provided on the insulating base 110. In FIG. 6, the wire probe is denoted by a reference numeral 11. Similar to the printed wiring board 100, the printed wiring board 100A is provided with the ground layer 160. Although not illustrated, the printed wiring board 100A is provided with the interlayer conductive path (the filled via hole, the through hole, and the like) that electrically connects the three ground wires 120A, 120B, 120C and the ground layer 160.

Of the two prepared probe devices, for example, the first probe device has probe groups PG1 to PG5, and the second probe device 10 has probe groups PG6 to PG10.

Here, the single probe device may have all of the probe groups PG1 to PG 10. Such a probe device includes: the first probe group PG2 (PG4) configured to be able to abut against the one end (the input end, for example) of the signal wire 130; the second probe group PG7 (PG9) configured to be able to abut against the other end (the output end, for example) of the signal wire 130.

As illustrated in FIG. 6, each of the probe groups PG1 to PG10 has five wire probes 11. In addition, the first probe device 10 is arranged such that the probe group PG1 contacts an input end of the ground wire 120A, that the probe group PG2 contacts an input end of the signal wire 130A, that the probe group PG3 contacts an input end of the ground wire 120B, that the probe group PG4 contacts an input end of the signal wire 130B, and that the probe group PG5 contacts an input end of the ground wire 120C. Furthermore, the second probe device is arranged such that the probe group PG6 contacts an output end of the ground wire 120A, that the probe group PG7 contacts an output end of the signal wire 130A, the probe group PG8 contacts an output end of the ground wire 120B, that the probe group PG9 contacts an output end of the signal wire 130B, and that the probe group PG10 contacts an output end of the ground wire 120C.

In the case of measuring the transmission loss, in step S2, the signal wire 130A receives the AC signal via the probe group PG2. For example, the signal wire receives a 5 GHz AC signal. Then, in step S3, the signal transmitted through the signal wire 130A is detected via the probe group PG7. In this way, the transmission loss by the signal wire 130A is measured. Similarly, the signal wire 130B receives the AC signal via the probe group PG4, and the signal transmitted through the signal wire 130B is detected via the probe group PG9. In this way, the transmission loss by the signal wire 130B is measured.

In the case of measuring the crosstalk, in step S2, the signal wire 130A receives the AC signal via the probe group PG2. Then, in step S3, the signal leaked to the signal wire 130B is detected via the probe group PG4. In this way, near-end crosstalk between the signal wire 130A and the signal wire 130B is measured. In addition, the signal wire 130A receives the AC signal via the probe group PG2, and the signal leaked to the signal wire 130B is detected via the probe group PG9. In this way, far-end crosstalk between the signal wire 130A and the signal wire 130B is measured.

As will be described later, the characteristic impedance of the probe device 10 according to the present embodiment substantially matches the characteristic impedance of each of the wires of the printed wiring board 100. Thus, according to the electrical inspection apparatus and the electrical inspection method described above, while the inexpensive general-purpose probe pin is used, it is possible to accurately measure the electrical characteristic (in particular, the electrical characteristic for the high-frequency signal) of the printed wiring board.

Furthermore, the probe device and the printed wiring board can be connected collectively by increasing the number of the probe groups according to the number of the wires of the printed wiring board. In this way, the probe device does not have to be moved for each of the wires targeted for the inspection. Thus, the electrical inspection can be conducted efficiently.

<Electromagnetic Field Analysis Simulation>

Figure 7:
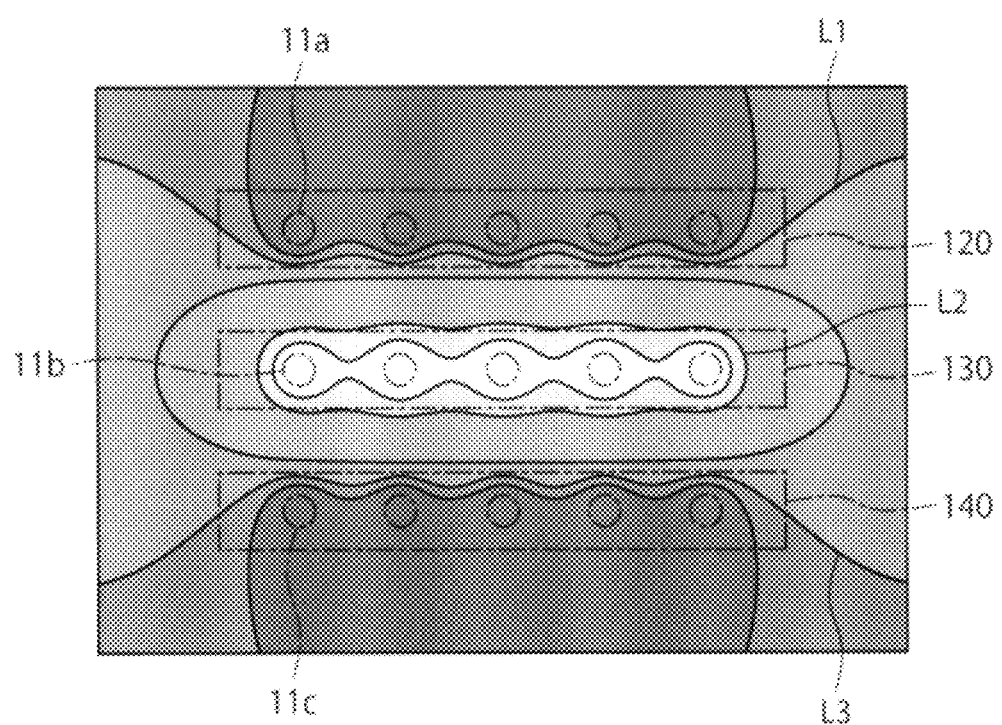
FIG. 7 is a view of a result of an electromagnetic field analysis simulation in cases illustrated in FIG. 4 and FIG. 5.
Figure 8:
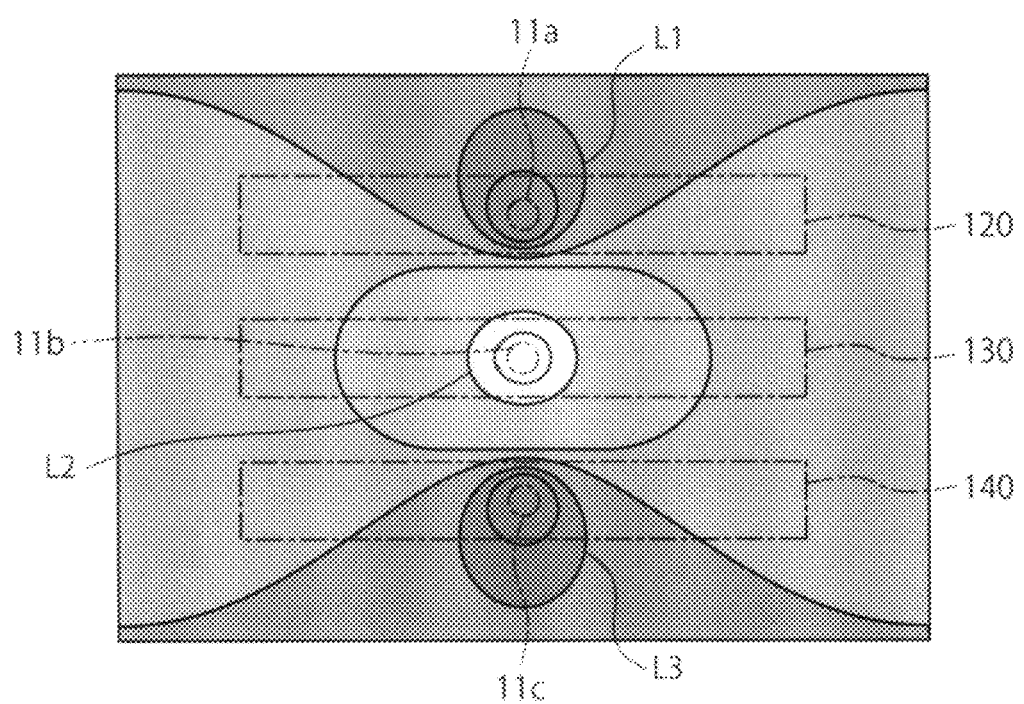
FIG. 8 is a view of a result of an electromagnetic field analysis simulation in a case of a modified example.

Next, a description will be made on a result of the electromagnetic field analysis simulation with reference to FIG. 7 and FIG. 8. FIG. 7 illustrates the result of the simulation when the probe device 10 is used. FIG. 8 illustrates the result of the simulation when the conventional probe device according to a comparative example is used. In the comparative example, the wire probe is made to abut against each of the wires of the printed wiring board one by one.

Parameters at the time of conducting the simulation are the diameter and the arrangement of the wire probe and relative permittivity of a dielectric region other than the probe device. Here, the diameter of the wire probe was set at 70 μm, and the probe pitch was set at 0.25 mm. A wiring pitch was set at 0.35 mm. The wiring pitch corresponds to a clearance between the probe groups (described later). The dielectric region around the probe device 10 was air, and thus the relative permittivity was set at 1. Note that the characteristic impedance is not frequency-dependent, and thus the frequency is unnecessary as the parameter.

As it is understood from the simulation result illustrated in FIG. 7, an equipotential line L2 has a substantially oval shape due to electric field coupling around the plurality of wire probes provided in the probe group PG2. Also, in regard to the probe groups PG1, PG3, equipotential lines L1, L3 have a substantially oval shape on surface sides opposing the signal wire 130 due to the electric field coupling around the wire probes 11a, 11c. Just as described, each of the probe groups acts as a pseudo oval probe. As a result, the electric field coupling between the probe groups is intensified, and the characteristic impedance is lowered.

In reality, a simulation value of the characteristic impedance of the probe group PG2 was 49.0Ω, and thus the value close to the characteristic impedance (50Ω) of the signal wire 130 of the printed wiring board 100 could be obtained. Just as described, with the probe device according to the present embodiment, the characteristic impedance of the probe group can substantially match the characteristic impedance of the wire.

Meanwhile, in the case of the comparative example, as it is understood from the simulation result in FIG. 8, each of the equipotential lines L1, L2, L3 has a substantially circular shape by reflecting the shape of the single wire probe. A simulation value of the characteristic impedance of the wire probe 11b is 186Ω and significantly deviates from a target value of 50Ω.

From the above simulation results, it is understood that, when the probe group is constructed of the plurality of wire probes electrically connected to each other, the probe group functions as the substantially oval probe and thus can lower the characteristic impedance. As a result, the characteristic impedance of the probe group can approximate the characteristic impedance of the wire of the printed wiring board. Thus, the impedance matching can be achieved.

Therefore, according to the present embodiment, it is possible to accurately inspect the electrical characteristics of the printed wiring board. In particular, it is possible to accurately measure the electrical characteristics of the printed wiring board having the high-speed signal transmission wire.

Furthermore, the probe device according to the present embodiment can easily be produced by preparing the general-purpose probe pin, which can be prepared at the low cost, inserting and fixing the probe pin through the through hole, which is formed in a fixing member on the basis of the arrangement of the terminal of the printed wiring board. Thus, even when the number, the arrangement, or the like of the wires of the printed wiring board is changed, it is possible to easily produce the inexpensive probe device in a short period according to the changed wires. Therefore, according to the present embodiment, it is possible to conduct the electrical inspection of the printed wiring board at the low cost.

Moreover, in the probe device according to the present embodiment, it is possible to collectively bring the plurality of probe groups into contact with the plurality of wires of the printed wiring board. In this way, for example, the collective inspection can be conducted per product or per sheet (in the case of FPC). Therefore, according to the present embodiment, the electrical inspection of the printed wiring board can be conducted efficiently.

A description will hereinafter be made on prove devices (arrangement of probe pins) and results of electromagnetic field analysis simulation according to first to third modified examples. In any of the modified examples, the same effects as those of the above embodiment can be obtained.

First Modified Example

Figure 9:
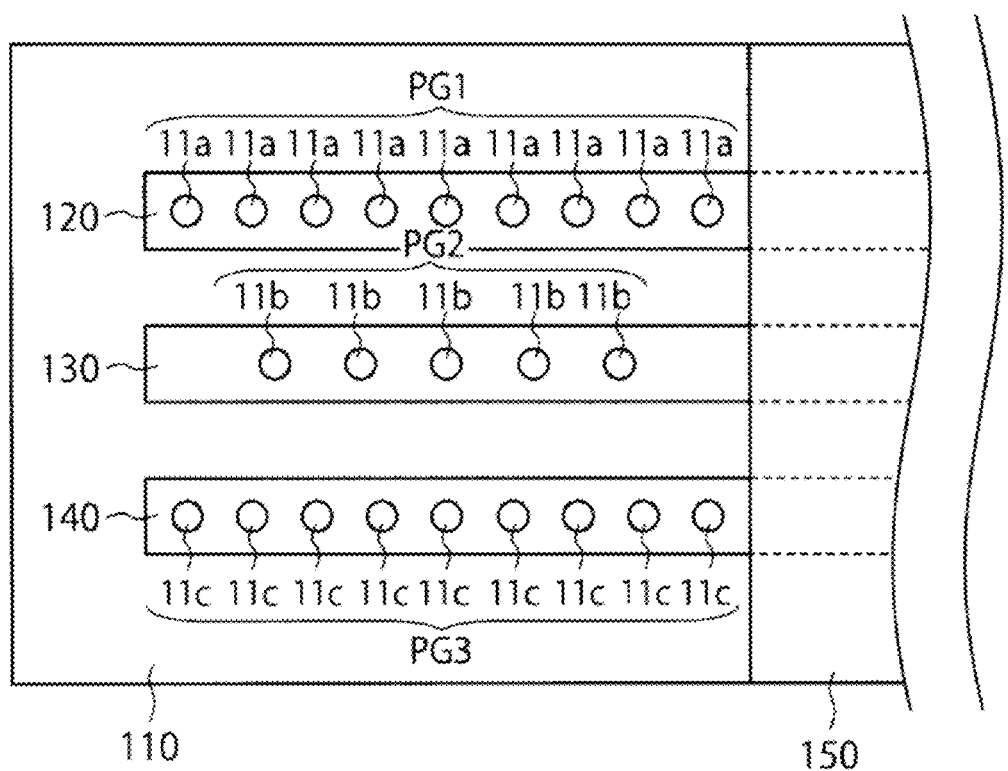
FIG. 9 is a plan view of a configuration of a wire probe in a probe device according to a first modified example of the embodiment.

As illustrated in FIG. 9, in the present modified example, the length of the probe group PG2, which abuts against the signal wire 130, is shorter than the length of the probe group PG1, which abuts against the ground wire 120, and is shorter than the length of the probe group PG3, which abuts against the ground wire 140. The number of the wire probes provided in the probe groups PG1, PG3, which respectively abut against the ground wires 120, 140, is larger than the number of the wire probes provided in the probe group PG2, which abuts against the signal wire 130. In the example in FIG. 9, the nine wire probes 11a are provided in the probe group PG1, the five wire probes 11b are provided in the probe group PG2, and the nine wire probes 11c are provided in the probe group PG3.

As a simulation condition, the diameter of the wire probe was set at 70 μm as in the previous example. The probe pitch of each of the probe groups PG1, PG3 was set at 0.15 mm. The probe pitch of the probe group PG2 was set at 0.20 mm, and the wiring pitch thereof is set at 0.35 mm.

Figure 10:
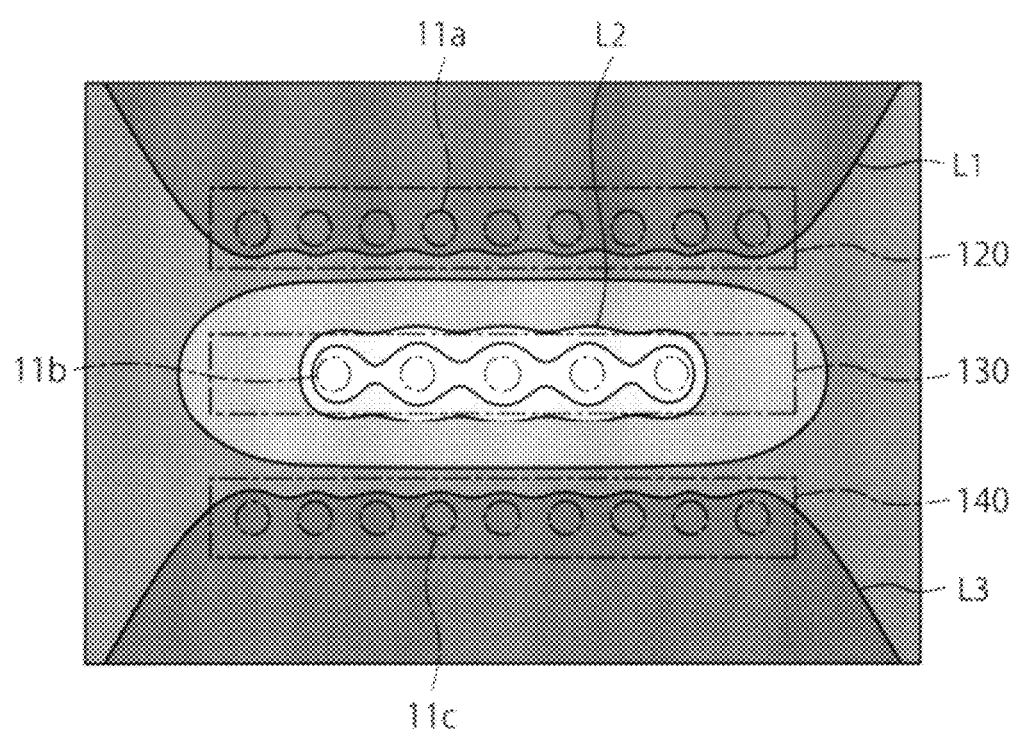
FIG. 10 is a view of a result of the electromagnetic field analysis simulation in a case illustrated in FIG. 9.

FIG. 10 illustrates the simulation results under the conditions such as the number and the arrangement of the wire probes described above. Similar to the case in FIG. 7, the equipotential line L2 around the five wire probes 11b, which is provided in the probe group PG2, has the substantially oval shape. Also, in regard to the probe groups PG1, PG3, the equipotential lines L1, L3 around the wire probes 11a, 11c have the substantially oval shape on the surface sides opposing the signal wire 130. Compared to the case in FIG. 7, in the present modified example, the number of the wire probes provided in each of the probe groups PG1, PG3 is increased, and the probe pitch thereof is reduced. Accordingly, the shape of each of the equipotential lines L1, L3 has reduced unevenness and is further flattened on the surface side opposing the signal wire 130. The simulation value of the characteristic impedance of the probe group PG2 was 50.5Ω, and thus the value close to the characteristic impedance (50Ω) of the wire of the printed wiring board 100 could be obtained.

Second Modified Example

Figure 11:
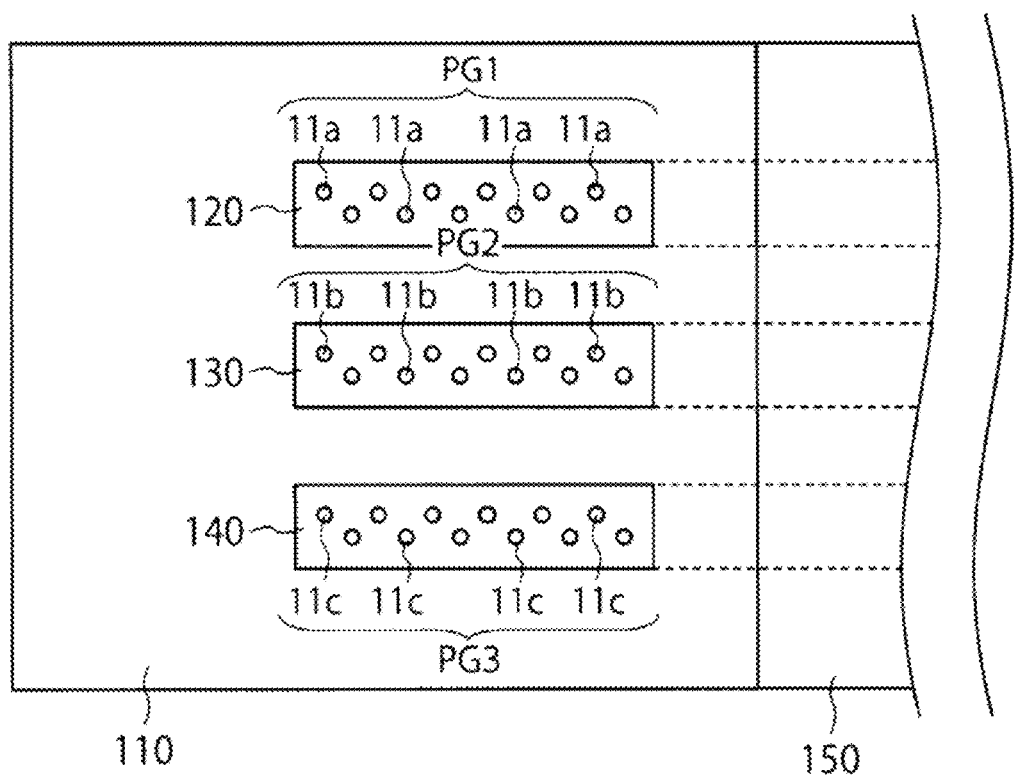
FIG. 11 is a plan view of a configuration of a wire probe in a probe device according to a second modified example of the embodiment.

In the present modified example, the plurality of wire probes provided in the probe group are arranged in a staggered manner when viewed in the extending direction of the wires of the printed wiring board. As illustrated in FIG. 11, any of the probe groups PG1 to PG3 has the wire probes 11a to 11c arranged in the staggered manner.

As the simulation conditions, the diameters of all of the wire probe were set at 32 μm, the probe pitch in an X direction (the wire extending direction) was set at 0.0625 mm, and the probe pitch in a Y direction (a direction orthogonal to the X direction) was set at 0.0625 mm. The probe pitch of the wire probe that is located on a straight line parallel to the X direction was 0.125 mm (=0.0625 mm×2). The wiring pitch thereof was set at 0.35 mm.

Figure 12:
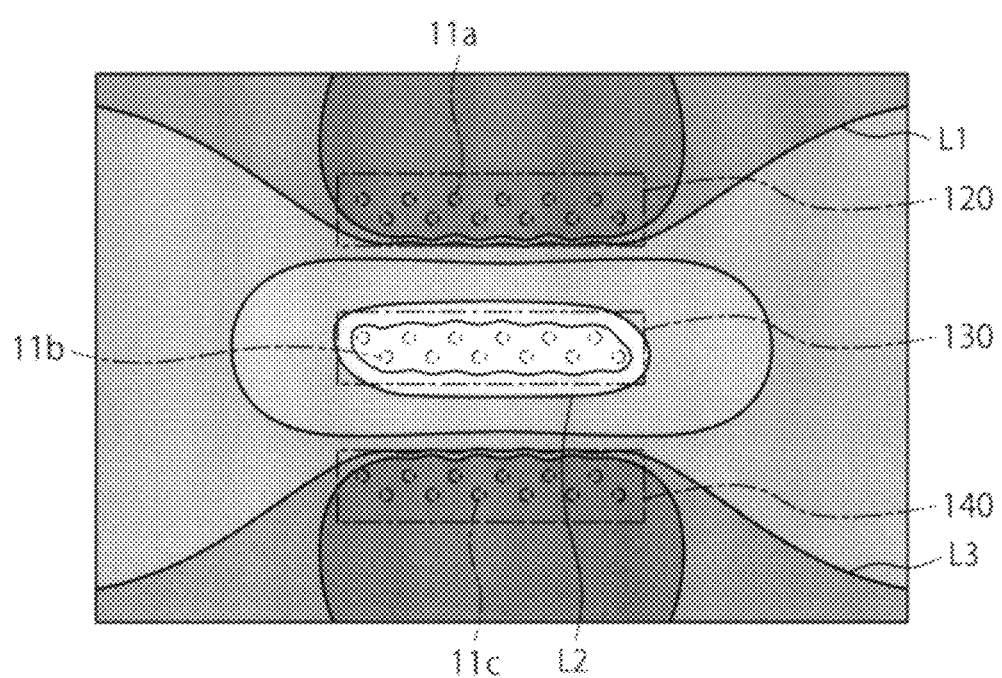
FIG. 12 is a view of a result of the electromagnetic field analysis simulation in a case illustrated in FIG. 11.

FIG. 12 illustrates the simulation results under the conditions such as the number and the arrangement of the wire probes described above. Similar to the case in FIG. 7, the equipotential line L2 around the twelve wire probes 11b, which are provided in the probe group PG2, has the substantially oval shape. Also, in regard to the probe groups PG1, PG3, the equipotential lines L1, L3 around the wire probes 11a, 11c have the substantially oval shape on the surface sides opposing the signal wire 130. The simulation value of the characteristic impedance of the probe group PG2 was 61.9Ω.

Third Modified Example

Figure 13:
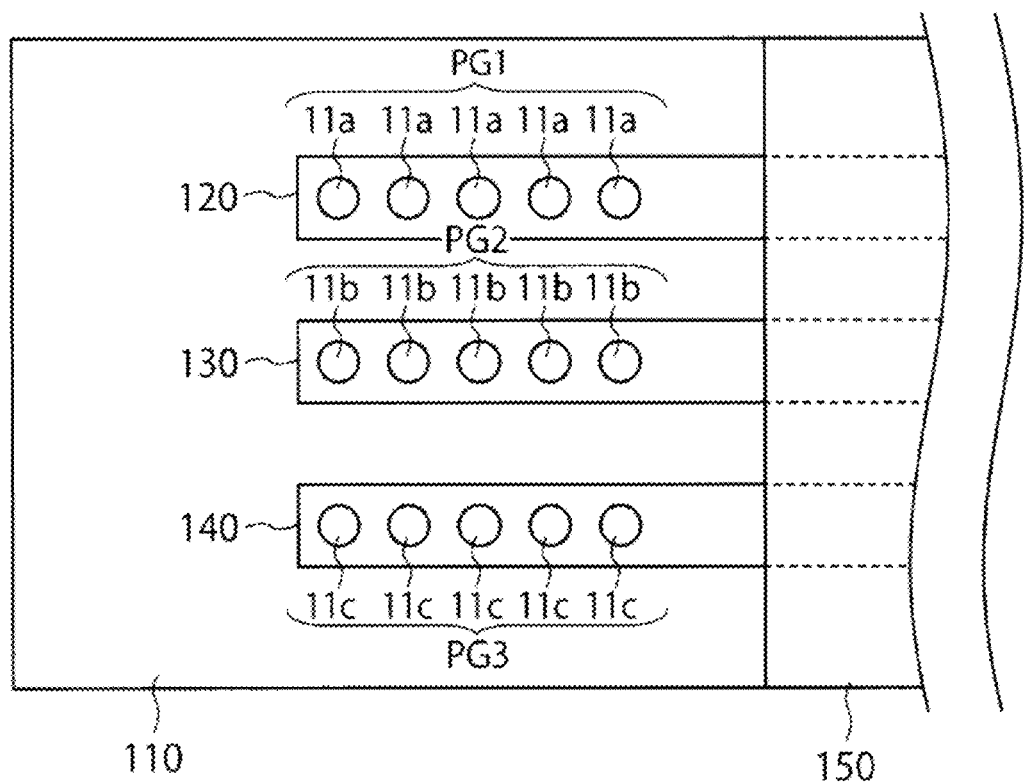
FIG. 13 is a plan view of a configuration of a wire probe in a probe device according to a third modified example of the embodiment.

As illustrated in FIG. 13, in the present modified example, each of the plurality of wire probes provided in the probe group has the larger diameter than those in FIG. 7. That is, as the simulation condition, the diameter of the wire probe was set at 90 μm. The probe pitch of each of the probe groups PG1 to PG3 was set at 0.15 mm, and the wiring pitch thereof was set at 0.35 mm.

Figure 14:
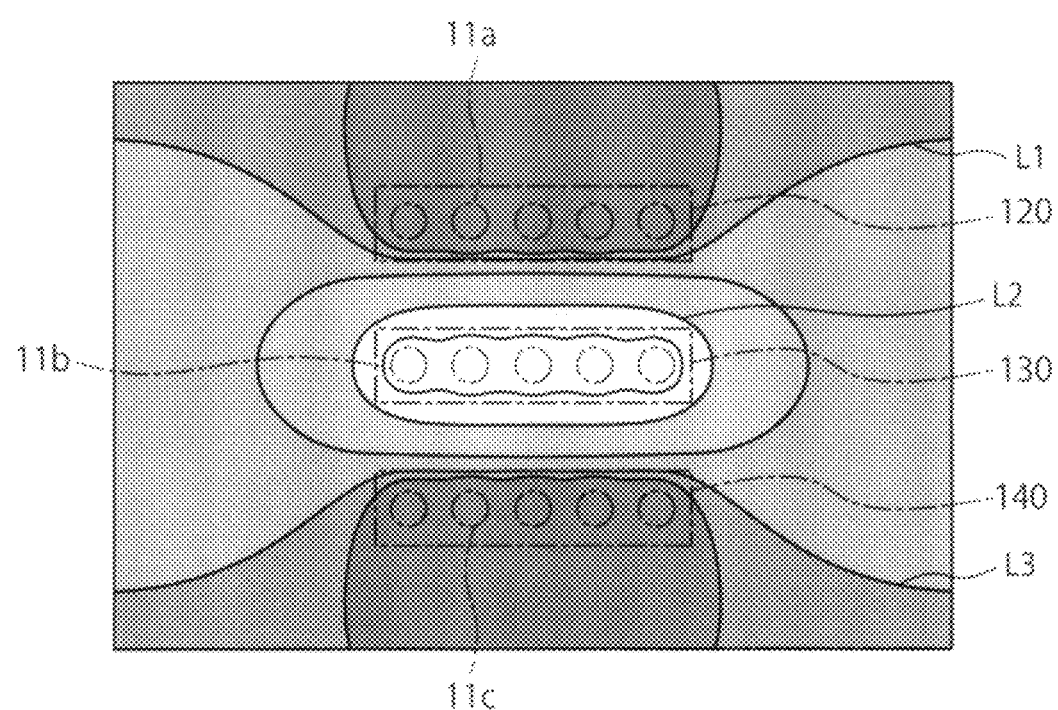
FIG. 14 is a view of a result of the electromagnetic field analysis simulation in a case illustrated in FIG. 13.

FIG. 14 illustrates the simulation results under the conditions such as the number and the arrangement of the wire probes described above. Similar to the case in FIG. 7, the equipotential line L2 around the five wire probes 11b, which are provided in the probe group PG2 and have the large diameter, has the substantially oval shape. Also, in regard to the probe groups PG1, PG3, the equipotential lines L1, L3 around the wire probes 11a, 11c having the large diameter have the substantially oval shape on the surface sides opposing the signal wire 130. The simulation value of the characteristic impedance of the probe group PG2 was 57.0Ω.

From the simulation results according to the embodiment and the first to third modified examples, it is understood that the characteristic impedances of the probe groups can be controlled according to the diameter of the probe pin, the probe pitch, the length of each of the probe groups, the clearance between the probe groups, the arrangement form of the probe pin (the straight line shape, the staggered manner, or the like), and the like.

A person skilled in the art could possibly arrive at additional effects and various modifications of the present invention on the basis of the above description. However, the aspect of the present invention is not limited to the above-described embodiment. Various additions, changes, and partial deletion can be made within the scope that does not depart from the conceptual sprit and gist of the present invention derived from the contents specified in the claims and equivalents thereof.

What is claimed is:

1. A probe device used for electrical inspection of a printed wiring board, the probe device comprising:
   at least one probe group including a plurality of probe pins configured to be able to simultaneously abut against a wire provided on the printed wiring board and extending in a specified direction, the plurality of probe pins abutting against the wire along the specified direction and being electrically connected to each other,
   wherein the at least one probe group includes a first probe group and a second probe group arranged in parallel with each other, and
   wherein a length of the first probe group is greater than a distance between the first probe group and the second probe group, and a length of the second probe group is greater than the distance and wherein the probe pins in each of the first probe group and the second probe groups are electrically connected to each other.

2. The probe device according to claim 1, wherein a characteristic impedance of the at least one probe group substantially matches a characteristic impedance of the wire of the printed wiring board.

3. The probe device according to claim 1, wherein a probe pitch of the at least one probe group is shorter than a length that is four times a diameter of each of the probe pins.

4. The probe device according to claim 1, wherein the plurality of probe pins are arranged on a straight line.

5. The probe device according to claim 1, wherein the plurality of probe pins are arranged in a staggered manner when viewed in the specified direction.

6. The probe device according to claim 1, wherein the first probe group is configured to be able to abut against one end of the wire, and the second probe group is configured to be able to abut against the other end of the wire.

7. The probe device according to claim 1, wherein
   the wire includes a ground wire and a signal wire that is adjacent to the ground wire, and
   the first probe group is configured to be able to abut against the ground wire, and the second probe group is configured to be able to abut against the signal wire.

8. The probe device according to claim 1, wherein
   the at least one probe group further includes a third probe group arranged in parallel with each of the first probe group and the second probe group, and
   wherein the wire includes a signal wire, and a first ground wire and a second ground wire holding the signal wire therebetween, and
   the first probe group is configured to be able to abut against the first ground wire, the second probe group is configured to be able to abut against the signal wire, and the third probe group is configured to be able to abut against the second ground wire.

9. The probe device according to claim 8, wherein the length of the second probe group is shorter than the length of the first probe group and is shorter than a length of the third probe group.

10. The probe device according to claim 9, wherein a probe pitch of each of the first and third probe groups is shorter than a probe pitch of the second probe group.

11. The probe device according to claim 8, wherein the probe pins provided in the first probe group to the third probe group are arranged on a straight line when viewed in a direction orthogonal to the specified direction.

12. The probe device according to claim 1, further comprising:
   a first fixing member that fixes a base end side of the probe pin provided in the at least one probe group;
   a second fixing member that fixes a tip end side of the probe pin provided in the at least one probe group; and
   a spacer member that connects the first fixing member and the second fixing member.

13. An electrical inspection apparatus for inspecting an electrical characteristic of a printed wiring board by using the probe device according to claim 1.

14. A method for inspecting an electrical characteristic of a printed wiring board by using the electrical inspection apparatus according to claim 13, the method comprising:
   making the at least one probe group abut against the wire;

applying a measurement signal to the signal wire via the probe group that abuts against the signal wire of the printed wiring board; and receiving a signal detected by the probe device.

* * * * *